(12) United States Patent
Chi

(10) Patent No.: US 12,002,503 B2
(45) Date of Patent: Jun. 4, 2024

(54) MEMORY CIRCUIT AND MEMORY

(71) Applicant: CHANGXIN MEMORY TECHNOLOGIES, INC., Hefei (CN)

(72) Inventor: Sungsoo Chi, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 146 days.

(21) Appl. No.: 17/814,002

(22) Filed: Jul. 21, 2022

(65) Prior Publication Data

US 2023/0077468 A1 Mar. 16, 2023

Related U.S. Application Data

(63) Continuation of application No. PCT/CN2022/097338, filed on Jun. 7, 2022.

(30) Foreign Application Priority Data

Sep. 13, 2021 (CN) .......................... 202111068865.8

(51) Int. Cl.
| | | |
|---|---|---|
| G11C 7/04 | (2006.01) | |
| G11C 11/408 | (2006.01) | |
| G11C 11/4091 | (2006.01) | |
| G11C 11/4096 | (2006.01) | |

(52) U.S. Cl.
CPC ...... G11C 11/4087 (2013.01); G11C 11/4091 (2013.01); G11C 11/4096 (2013.01)

(58) Field of Classification Search
CPC ...................................................... G11C 7/04
See application file for complete search history.

(56) References Cited

U.S. PATENT DOCUMENTS

| | | |
|---|---|---|
| 5,317,535 A | 5/1994 | Talreja et al. |
| 6,721,223 B2 | 4/2004 | Matsumoto et al. |
| 8,098,540 B2 | 1/2012 | Rao et al. |
| 9,934,827 B2 | 4/2018 | Wu et al. |

(Continued)

FOREIGN PATENT DOCUMENTS

| | | |
|---|---|---|
| CN | 1392565 A | 1/2003 |
| CN | 102077289 A | 5/2011 |

(Continued)

OTHER PUBLICATIONS

International Search Report cited in PCT/CN2022/087420 dated Jul. 4, 2022, 8 pages.

(Continued)

*Primary Examiner* — Jason Lappas
(74) *Attorney, Agent, or Firm* — Cooper Legal Group, LLC

(57) ABSTRACT

The present disclosure provides a memory circuit and a memory. The memory circuit at least includes a plurality of memory blocks. Each of the memory blocks includes a first memory sub-block, a second memory sub-block, and a third memory sub-block arranged in sequence; the second memory sub-block includes a first memory unit and a second memory unit; the first memory sub-block and the first memory unit are configured to store high-order bytes; the second memory unit and the third memory sub-block are configured to store low-order bytes; and in an arrangement direction of memory sub-blocks, different memory units that are arranged side by side have different block selection addresses.

15 Claims, 4 Drawing Sheets

(56) References Cited

U.S. PATENT DOCUMENTS

2016/0352223 A1* 12/2016 Choo ................ H03F 1/301
2019/0196744 A1  6/2019 Kim
2021/0173559 A1  6/2021 Nishikawa et al.

FOREIGN PATENT DOCUMENTS

CN  110164487 A  8/2019
CN  112712831 A  4/2021

OTHER PUBLICATIONS

International Search Report cited in PCT/CN2022/097338 dated Sep. 8, 2022, 9 pages.

* cited by examiner

MEMORY CIRCUIT AND MEMORY

CROSS-REFERENCE TO RELATED APPLICATIONS

This is a continuation of International Application No. PCT/CN2022/097338, filed on Jun. 7, 2022, which is based on and claims the priority to Chinese Patent Application No. 202111068865.8, titled "MEMORY CIRCUIT AND MEMORY", and filed on Sep. 13, 2021. The entire contents of International Application No. PCT/CN2022/097338 and Chinese Patent Application No. 202111068865.8 are herein incorporated into the present disclosure by reference.

TECHNICAL FIELD

The present disclosure relates to, but is not limited to, a memory circuit and a memory.

BACKGROUND

As a high-speed large-capacity data storage carrier, the dynamic random access memory (DRAM) is an indispensable part of most electronic systems. The smallest memory cell in the DRAM includes a capacitor and a transistor. The operation mechanism of the DRAM is divided into read and write. When a read operation is performed, a bit line (BL) is first charged to half of an operating voltage (VDD/2), and then the transistor is turned on through a word line (WL), such that the capacitor and the BL generate the phenomenon of charge sharing; if the internal storage value of the capacitor is 1, the voltage of the BL will be raised to be higher than half of the operating voltage by the charge sharing; if the internal storage value of the capacitor is 0, the voltage of the BL will be pulled down to be lower than half of the operating voltage; and after the voltage of the BL is obtained, it needs to be amplified by an amplifier to determine the internal storage value of the capacitor. When a write operation is performed, the WL controls the transistor to be turned on; if 1 needs to be written, the voltage of the BL is raised to the operating voltage, such that the capacitor stores the corresponding charge; and if 0 needs to be written, the voltage of the BL is lowered to a low level to discharge the charge in the capacitor.

SUMMARY

An overview of the subject matter described in detail in the present disclosure is provided below, which is not intended to limit the protection scope of the claims.

The present disclosure provides a memory circuit and a memory.

A first aspect of the present disclosure provides a memory circuit, including: a plurality of memory blocks, wherein each of the memory blocks includes a first memory sub-block, a second memory sub-block, and a third memory sub-block arranged in sequence; the second memory sub-block includes a first memory unit and a second memory unit; the first memory sub-block and the first memory unit are configured to store high-order bytes; the second memory unit and the third memory sub-block are configured to store low-order bytes; and in an arrangement direction of memory sub-blocks, different memory units that are arranged side by side have different block selection addresses.

A second aspect of the present disclosure provides a memory, including the memory circuit according to the first aspect.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may obtain other accompanying drawings based on these accompanying drawings without creative efforts.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

Figure 1:
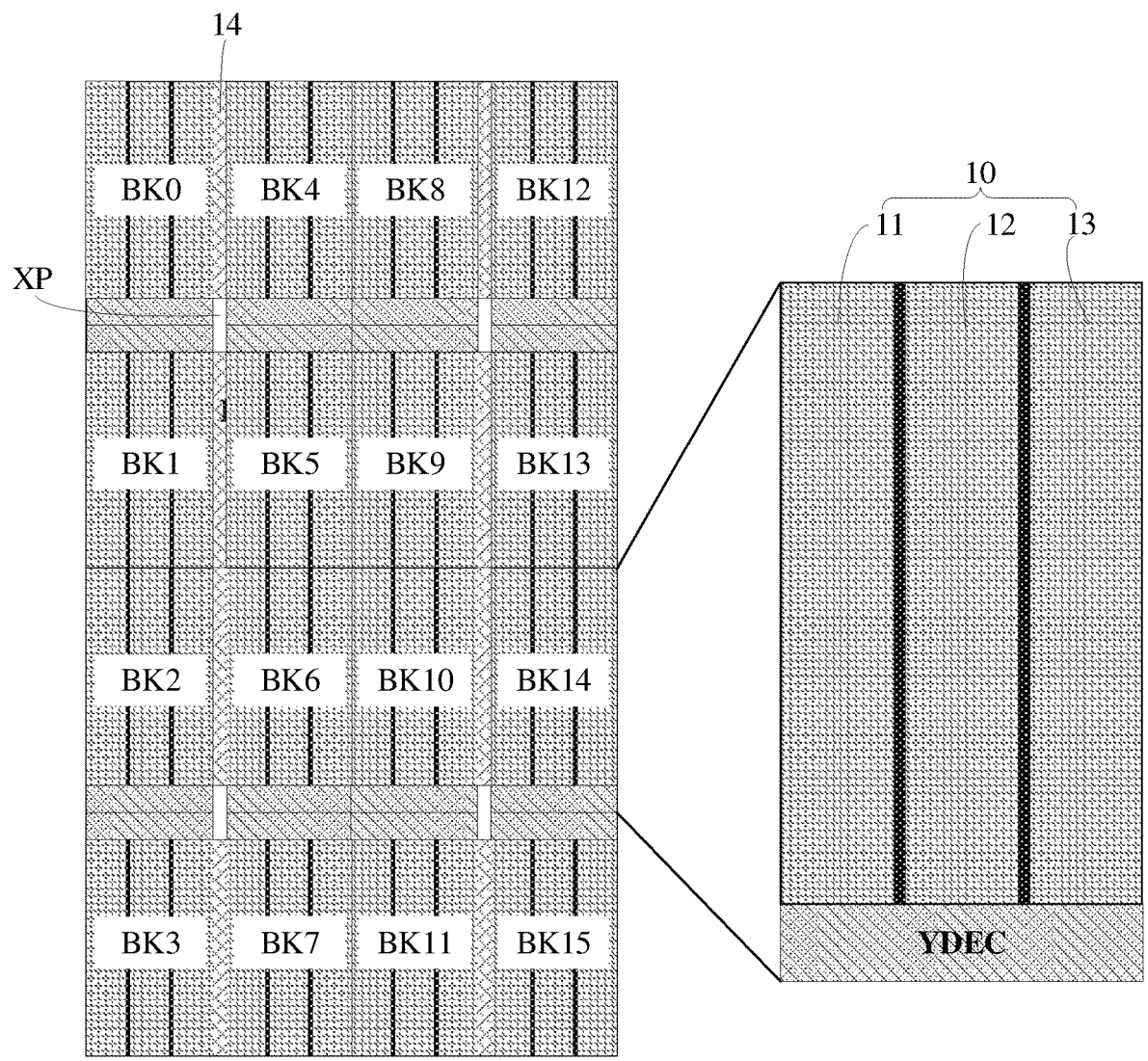
FIG. 1 to FIG. 4 are schematic structural diagrams of a memory circuit according to embodiments of the present disclosure.
Figure 2:
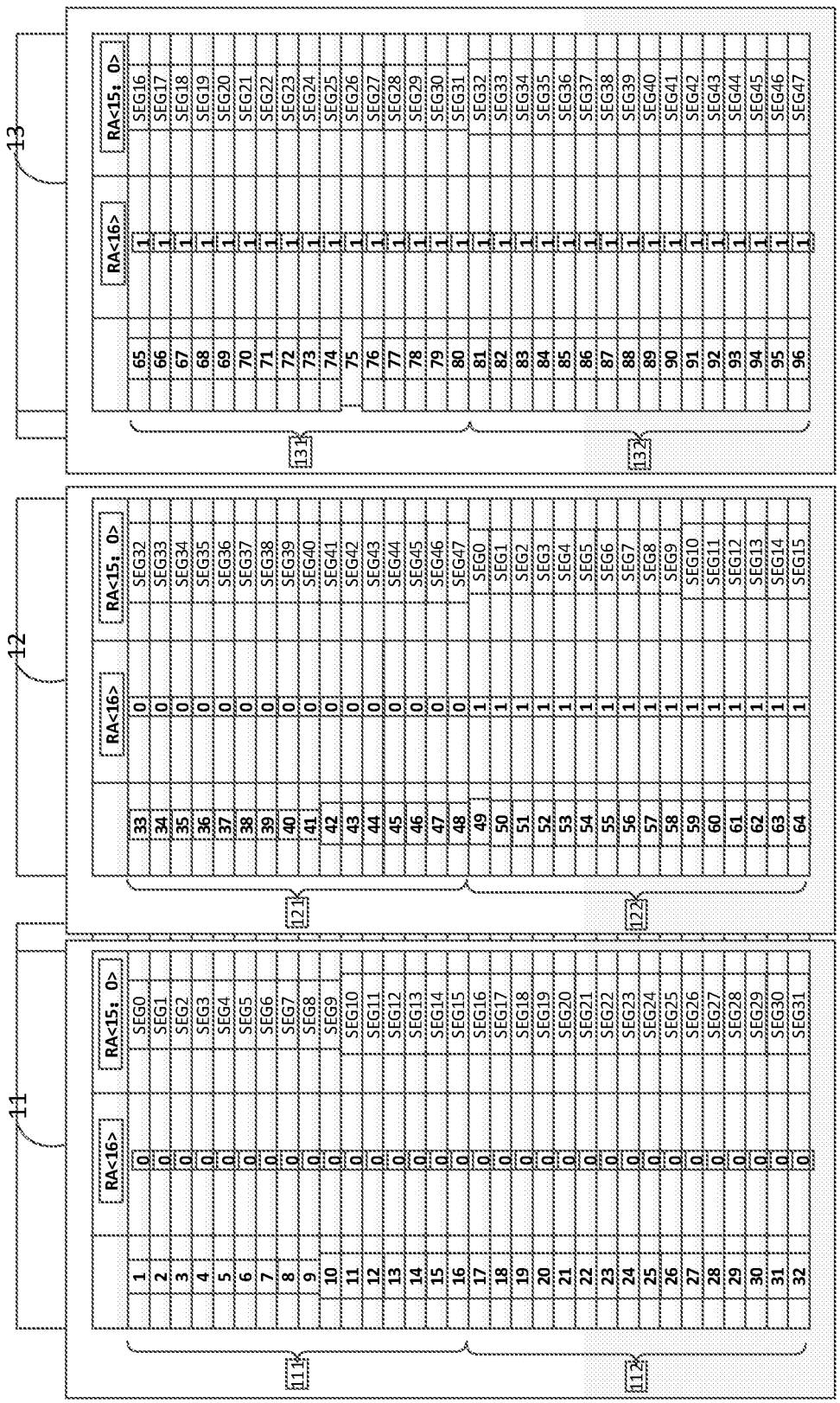

Referring to FIG. 1 and FIG. 2, the memory circuit includes a plurality of memory blocks 10. Each of the memory blocks 10 includes a first memory sub-block 11, a second memory sub-block 12, and a third memory sub-block 13 arranged in sequence; the second memory sub-block 12 includes a first memory unit 121 and a second memory unit 122; the first memory sub-block 11 and the first memory unit 121 are configured to store high-order bytes; the second memory unit 122 and the third memory sub-block 13 are configured to store low-order bytes; and in an arrangement direction of the memory sub-blocks, different memory units that are arranged side by side have different block selection addresses.

The embodiments of the present disclosure will be described in more detail below with reference to the accompanying drawings.

Referring to FIG. 1, the memory circuit may include a plurality of memory blocks 10. As the capacity of the memory circuit changes, the capacity, number and arrangement of the memory blocks 10 also change accordingly. Taking the capacity of the memory circuit as 16 G and the capacity of each memory block 10 as 1 G as an example, the memory circuit includes 16 memory blocks 10 (BK0 to BK15), and the arrangement of the memory blocks 10 is 4×4. In addition, each memory block is provided with a corresponding row decoder (not marked) and column decoder YDEC. The row decoder is configured to receive a row address signal and activate a corresponding word line, the column decoder is configured to obtain a readout signal of a bit line at a specific column address, and the readout signal is amplified by a sense amplifier and then inputted into a local input-output line.

It should be noted that the memory circuit structure provided by one embodiment of the present disclosure is not only applicable to the capacity of 16 G or below, but also applicable to the capacity of 16 G or above. The adjacent memory blocks 10 share the same peripheral circuit region 14, the peripheral circuit region 14 can include a decoding circuit connected to a word line driver, and the word line driver is configured to drive the word lines in the memory blocks 10. When the arrangement is 4×4, each row is provided with two peripheral circuit regions 14. In addition, the peripheral circuit region 14 and the column decoder YEDC are located on different sides of the memory block 10.

In addition, the memory circuit further includes an intersection region circuit XP between every two of four memory blocks 10 (such as BK0, BK1, BK4, and BK5) adjacent to each other. The intersection region circuit XP may be internally provided with structures such as a pull-up drive circuit, a local equalization circuit, an input-output equalization circuit, a precharge circuit, and an equalization drive circuit. The pull-up drive circuit is configured to provide an operating voltage for a first electrode line to activate the sense amplifier. The local equalization circuit is connected in series between the first electrode line and a second electrode line and configured to connect or disconnect the first electrode line and the second electrode line; and if the first electrode line and the second electrode line are connected, the sense amplifier cannot be activated. The input-output equalization circuit and the precharge circuit are connected in series between a pair of bit lines, the precharge circuit is configured to raise a voltage of the pair of bit lines to half of the operating voltage, and the input-output equalization circuit is configured to share a charge of the pair of bit lines. The equalization drive circuit is configured to activate the input-output equalization circuit and the precharge circuit.

In some embodiments, the number of memory segments in the first memory sub-block 11 is the same as the number of memory segments in the third memory sub-block 13, and the number of memory segments in the first memory unit 121 is the same as the number of memory segments in the second memory unit 122. In this way, it is beneficial to make the number of memory segments storing the high-order bytes equal to the number of memory segments storing the low-order bytes, thereby ensuring that the memory block can effectively store the high-order bytes and the low-order bytes having the same number of bits, avoiding the occurrence of redundancy in the memory segments storing the high-order bytes or the low-order bytes, and increasing the utilization rate of the memory block.

Taking the embodiment shown in FIG. 2 as an example, the first memory sub-block 11 includes 32 memory segments (SEG0U-SEG31U corresponding to 1U-32U), where "U" indicates that the memory segments store the high-order bytes, and the third memory sub-block 13 also includes 32 memory segments (SEG16L-SEG47L corresponding to 17L-48L), where "L" indicates that the memory segments store the low-order bytes. Correspondingly, the first memory unit 121 includes 16 memory segments (SEG0L-SEG15L corresponding to 1L-16L), and the second memory unit 122 also includes 16 memory segments (SEG32U-SEG47U corresponding to 33U-48U), where "U" indicates that the memory segments store the high-order bytes. It should be noted that as the capacity of the memory circuit and the capacity of the memory block change, the number of memory segments included in each memory sub-block also changes. For example, if the capacity of each memory block is doubled, the number of memory segments included in each memory sub-block is also doubled.

In addition, when the number of the memory segments storing the high-order bytes is the same as the number of the memory segments storing the low-order bytes, if each memory segment includes the same number of word lines, the memory segments storing the high-order bytes and the memory segments storing the low-order bytes include the same number of word lines. It should be noted that in different memories, the number of memory cells included in the memory segments may be different. In some embodiments, a sum of the number of memory segments in the first memory unit 121 and the number of memory segments in the second memory unit 122 is equal to the number of memory segments in the first memory sub-block 11. That is to say, the first memory sub-block 11, the second memory sub-block 12, and the third memory sub-block 13 have the same number of memory segments.

As shown in FIG. 2, the first memory sub-block 11, the second memory sub-block 12, and the third memory sub-block 13 all include 48 memory segments. In some another embodiments, the sum of the number of memory segments in the first memory unit 121 and the number of memory segments in the second memory unit 122 may also be smaller than the number of memory segments in the first memory sub-block 11. In this way, all the memory segments in the second memory sub-block 12 may also share a row decoder with the first memory sub-block 11 or the third memory sub-block 13.

In some embodiments, referring to FIG. 1 and FIG. 2, a logical start address of the memory segments in the first memory sub-block 11, a logical start address of the memory segments in the second memory sub-block 12, and a logical start address of the third memory sub-block 13 are sequentially extended. A logical start address of the memory segments in the second memory unit 122 is later than a logical start address of the memory segments in the first memory unit 121. Since a physical address of a memory cell in the memory segment=a start address of the segment where the memory cell is located+an offset within the segment, a physical address of a memory cell in the second memory unit 122 is later than a physical address of a memory cell in the first memory unit 121, a physical address of a memory cell in the first memory sub-block 11 is not continuous with a physical address of a memory cell in the second memory unit 122, and accordingly, the physical address of the memory cell in the first memory unit 121 is not continuous with a physical address of a memory cell in the third memory sub-block 13.

In some embodiments, referring to FIG. 2, the first memory sub-block 11 includes a third memory unit 111 and a fourth memory unit 112; the third memory sub-block 13 includes a fifth memory unit 131 and a sixth memory unit 132; the third memory unit 111, the first memory unit 121, and the fifth memory unit 131 are arranged side by side; the fourth memory unit 112, the second memory unit 122, and the sixth memory unit 132 are arranged side by side; the first memory unit 121 and the third memory unit 111 include the same number of word lines; and the second memory unit 122 and the sixth memory unit 132 include the same number of word lines. In this way, it is advantageous for the first memory unit 121 and the second memory unit 122 to share the same row decoder with the memory units in the adjacent memory sub-blocks.

Exemplarily, the number of word lines in the first memory unit 121 is equal to the number of word lines in the second memory unit 122; the first memory unit 121, the third memory unit 111, and the fifth memory unit 131 have the same number of word lines; and the second memory unit 122, the fourth memory unit 112, and the sixth memory unit 132 have the same number of word lines.

Figure 3:
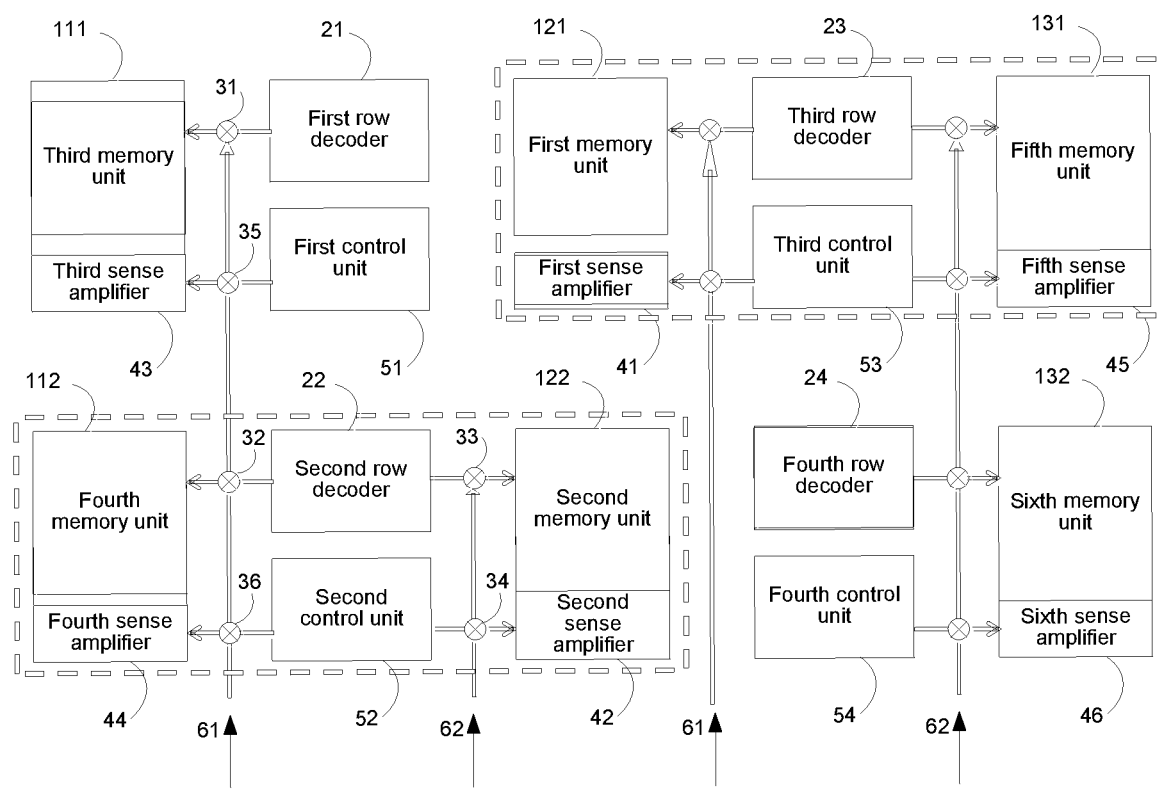

In some embodiments, referring to FIG. 3, the memory circuit further includes: a first row decoder 21 and a second row decoder 22, wherein the first row decoder 21 is located between the third memory unit 111 and the first memory unit 121, the second row decoder 22 is located between the fourth memory unit 112 and the second memory unit 122, the first row decoder 21 is configured to activate the word lines in the third memory unit 111, and the second row decoder 22 is configured to activate the word lines in the fourth memory unit 112 and the word lines in the second memory unit 122. Using the same row decoder to activate the word lines in different memory sub-blocks is conducive to saving the circuit area and simplifying the memory circuit. In addition, arranging the shared row decoder between two corresponding memory units is beneficial to shorten the circuit connection distance, avoid long RC delay caused by large wire resistance, and accelerate the read speed of the memory circuit. Moreover, two memory units that share a row decoder are provided for respectively storing the high-order bytes and the low-order bytes, thereby facilitating preventing the row decoder from activating a wrong bit line after receiving a row address.

It should be noted that the logical address of the memory segment includes a most significant byte (MSB) and a block selection address, the MSB is the leftmost bit RA<n> of the row address, and the block selection address is another bit RA<n−1:0> of the row address. Referring to FIG. 2, the MSB of the memory segments storing the high-order bytes is 0, and the MSB of the memory segments storing the low-order bytes is 1. Different memory blocks storing the same type of bytes (high-order bytes or low-order bytes) have different block selection addresses, such as SEG0-SEG47. Different memory blocks storing different types of bytes may have the same block selection address, such as SEG0-SEG47.

In some embodiments, referring to FIG. 3, the memory circuit further includes: a first switch circuit 31, a second switch circuit 32 and a third switch circuit 33, wherein the first switch circuit 31 connects the first row decoder 21 and the third memory unit 111, the second switch circuit 32 connects the second row decoder 22 and the fourth memory unit 112, the third switch circuit 33 connects the second row decoder 22 and the second memory unit 122, the first switch circuit 31 and the second switch circuit 32 are configured to receive a first flag signal 61 and be turned on, the third switch circuit is configured to receive a second flag signal 62 and be turned on, the first flag signal 61 represents reading the high-order bytes, and the second flag signal 62 represents reading the low-order bytes. The switch circuit is connected in series between the row decoder and the memory unit to turn on the row decoder and the memory unit storing the corresponding byte when the byte is read, which is beneficial to further prevent the row decoder from activating a wrong word line and improve the accuracy of the memory circuit reading data.

In some embodiments, referring to FIG. 3, the memory circuit further includes: a third row decoder 23 and a fourth row decoder 24, wherein the third row decoder 23 is located between the fifth memory unit 131 and the first memory unit 121, the fourth row decoder 24 is located between the sixth memory unit 132 and the second memory unit 122, the third row decoder 23 is configured to activate the word lines in the first memory unit 121 and the word lines in the fifth memory unit 131, and the fourth row decoder 24 is configured to activate the word lines in the sixth memory unit 132. The switch circuit connected in series between the third row decoder 23 and the fifth memory unit 131 is turned on when receiving the second flag signal 62, the switch circuit connected in series between the fourth row decoder 24 and the sixth memory unit 132 is turned on when receiving the second flag signal 62, and the switch circuit connected in series between the third row decoder 23 and the first memory unit 121 is turned on when receiving the first flag signal 61. Similar to the second row decoder 22 and the corresponding switch circuits, the setting of the third row decoder 23 is beneficial to simplify the circuit and increase the read rate of the memory circuit. In addition, the first row decoder 21 and the fourth row decoder 24 having similar connection relationships and functions are set at the same time.

Correspondingly, referring to FIG. 3, the memory circuit further includes: a first sense amplifier 41, a second sense amplifier 42, a third sense amplifier 43 and a fourth sense amplifier 44, wherein the first sense amplifier 41 is configured to amplify a readout signal of a bit line in the first memory unit 121, the second sense amplifier 42 is configured to amplify a readout signal of a bit line in the second memory unit 122, the third sense amplifier 43 is configured to amplify a readout signal of a bit line in the third memory unit 111, and the fourth sense amplifier 44 is configured to amplify a readout signal of a bit line in the fourth memory unit 112; a first control unit 51 and a second control unit 52, wherein the first control unit 51 is located between the first sense amplifier 41 and the third sense amplifier 43, the second control unit 52 is located between the second sense amplifier 42 and the fourth sense amplifier 44, the first control unit 51 is configured to control the third sense amplifier 43, and the second control unit 52 is configured to control the fourth sense amplifier 44 and the second sense amplifier 42. Similar to setting the second row decoder 22, setting the second control unit 52 to connect and control two adjacent sense amplifiers is beneficial to simplify the circuit and shorten the RC delay. Moreover, making the first control unit 51 and the first row decoder 21 have similar connection relationships with their adjacent components is beneficial to simplify the layout design of the memory circuit.

The first row decoder 21 and the first control unit 51 are both located between the first memory unit 121 and the third memory unit 111 and their corresponding sense amplifiers, and the first control unit 51 and the second control unit 52 are both located between the first memory sub-block 11 and the second memory sub-block 12.

In some embodiments, referring to FIG. 3, the memory circuit further includes: a fourth switch circuit 34, a fifth switch circuit 35 and a sixth switch circuit 36, wherein the fourth switch circuit 34 connects the second control unit 52 and the second sense amplifier 42, the fifth switch circuit 35 connects the first control unit 51 and the third sense amplifier 43, the sixth switch circuit 36 connects the second control unit 52 and the fourth sense amplifier 44, the fifth switch circuit 35 and the sixth switch circuit 36 are configured to receive a first flag signal 61 and be turned on, the fourth switch circuit 34 is configured to receive a second flag signal 62 and be turned on, the first flag signal 61 represents reading the high-order bytes, and the second flag signal 62 represents reading the low-order bytes. Similar to the setting of the switch circuits, by setting the switch circuits, the second control unit 52 is connected to the corresponding sense amplifier at a corresponding timing, which is beneficial to ensure that the second control unit 52 accurately controls the corresponding sense amplifier, thereby accurately amplifying a tiny readout signal on the corresponding bit line, and ensuring the accuracy of the memory circuit reading data.

In some embodiments, referring to FIG. 3, the memory circuit further includes: a third row decoder 23 and a fourth row decoder 24, wherein the third row decoder 23 is located between the first memory unit 121 and the fifth memory unit 131, the fourth row decoder 24 is located between the second memory unit 122 and the sixth memory unit 132, the third row decoder 23 is configured to activate the word lines in the first memory unit 121 and the word lines in the fifth memory unit 131, and the fourth row decoder 24 is configured to activate the word lines in the sixth memory unit 132.

Correspondingly, referring to FIG. 3, the memory circuit further includes: a fifth sense amplifier 45 and a sixth sense amplifier 46, wherein the fifth sense amplifier 45 is configured to amplify a readout signal of a bit line in the fifth memory unit 131, and the sixth sense amplifier 46 is configured to amplify a readout signal of a bit line in the sixth memory unit 132. In addition, the memory circuit further includes: a third control unit 53 and a fourth control unit 54, wherein the third control unit 53 is separately connected to the first sense amplifier 41 and the fifth sense amplifier 45 through different switch circuits for adjusting the first sense amplifier 41 when reading the high-order bytes and adjusting the fifth sense amplifier 45 when reading the low-order bytes, and the fourth control unit 54 is connected to the sixth sense amplifier 46 through the corresponding switch circuit for adjusting the sixth sense amplifier 46 when reading the low-order bytes.

Figure 4:
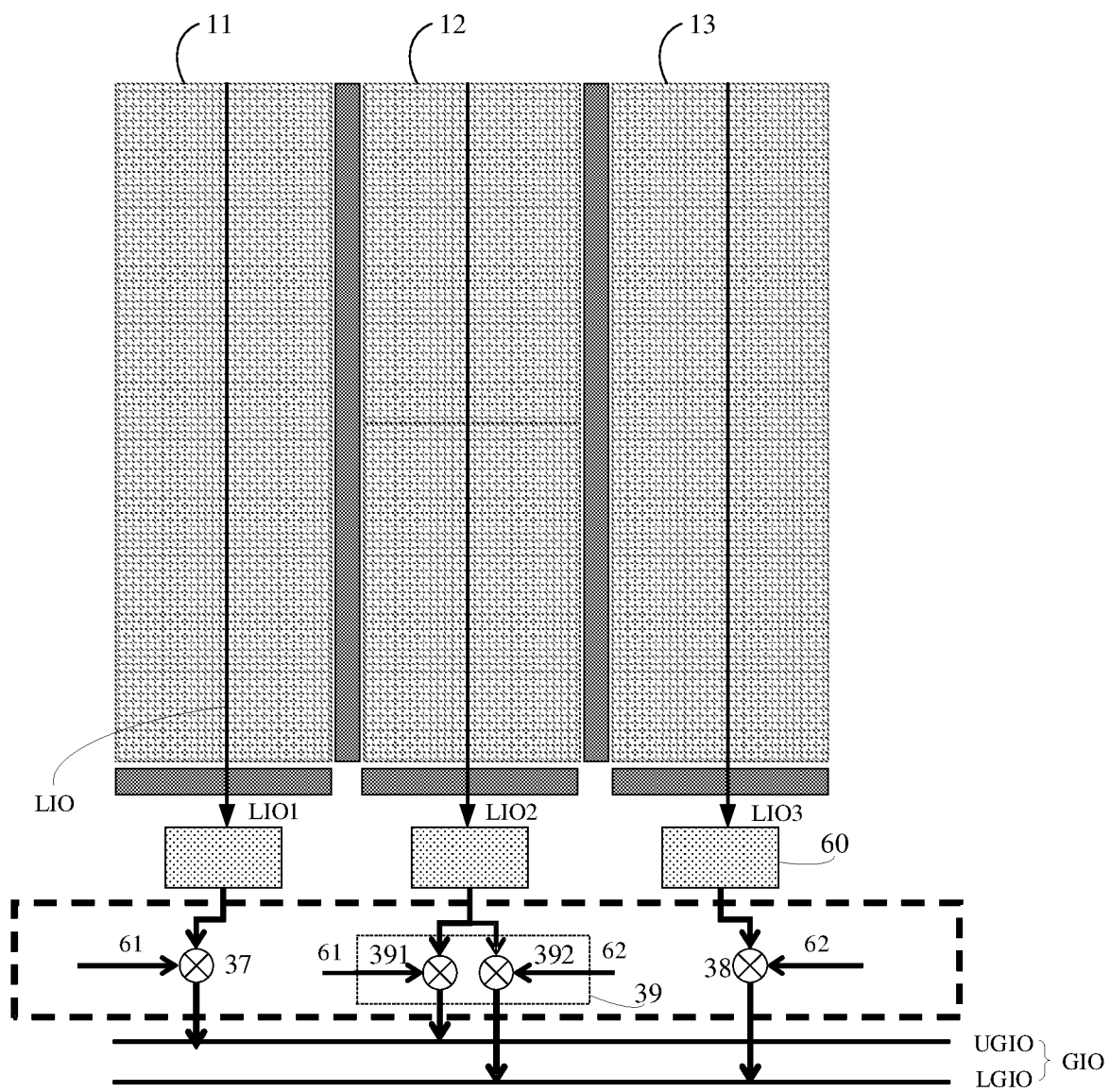

In some embodiments, referring to FIG. 4, the memory circuit further includes: a local input-output line LIO, a main amplifier 60 and a global input-output line GIO, wherein the local input-output line LIO is configured to transmit a readout signal amplified by a sense amplifier, the main amplifier 60 is configured to receive and amplify the readout signal outputted by the local input-output line LIO and transmit the reamplified readout signal to the global input-output line GIO.

It can be understood that each local input-output line LIO corresponds to one bit line, and the number of bit lines in the memory block 10 is the same as the number of columns of a memory array in the memory block 10. That is to say, the more the number of columns in the memory array, the more the number of bit lines in the memory block 10. Similarly, the number of bit lines in each memory sub-block is the same as the number of columns of the memory array in the memory sub-block. In addition, each local input-output line LIO corresponds to one main amplifier 60, and the main amplifier 60 is configured to receive and amplify the readout signal outputted by the corresponding local input-output line LIO, and the main amplifier 60 is connected to the corresponding global input-output line GIO according to the type of bytes stored in the memory sub-block.

In multi-byte data, bytes are divided into the high-order bytes and the low-order bytes. To ensure the accuracy of data reading, generally, the high-order bytes are transmitted by a high-order global input-output line UGIO, and the low-order bytes are transmitted by a low-order global input-output line LGIO. In some embodiments, the first memory sub-block 11, the second memory sub-block 12, and the third memory sub-block 13 all include 128 bit lines; and the global input-output line GIO is configured to transmit 16 bytes of data, where the first 8 bytes are the high-order bytes, and the last 8 bytes are the low-order bytes. Since each byte is 8 bits, the global input-output line GIO is configured to transmit 128-bit data.

Referring to FIG. 4, the local input-output line LIO includes a first local input-output line LIO1 and a third local input-output line LIO3, wherein the first local input-output line LIO1 is connected to the first memory sub-block 11, and the third local input-output line LIO3 is connected to the third memory sub-block 13. The global input-output line GIO includes a high-order global input-output line UGIO and a low-order global input-output line LGIO. In addition, the memory circuit further includes: a seventh switch circuit 37, configured to connect the first local input-output line LIO1 and the high-order global input-output line UGIO, and further configured to receive a first flag signal 61 and be turned on; and an eighth switch circuit 38, configured to connect the third local input-output line LIO3 and the low-order global input-output line LGIO, and further configured to receive a second flag signal 62 and be turned on.

In addition, the local input-output line LIO further includes a second local input-output line LIO2 connected to the second memory sub-block 12. The memory circuit further includes: a selector 39 provided with one terminal connected to the second local input-output line LIO2 to receive the first flag signal 61 or the second flag signal 62, wherein when the first flag signal 61 is received, the second local input-output line LIO2 and the high-order global input-output line UGIO are connected; and when the second flag signal 62 is received, the second local input-output line LIO2 and the low-order global input-output line LGIO are connected.

In some embodiments, the main input-output line and the intersection region circuit XP (referring to FIG. 1) are also connected in series between the local input-output line LIO and the main amplifier 60. After being amplified by the sense amplifier and activated by a column select signal, the readout signal of the bit line is sequentially transmitted to the local input-output line LIO, the intersection region circuit, the main input-output line, and the main amplifier 60; and after the main amplifier 60 amplifies the readout signal of the bit line for the second time, the readout signal is transmitted to a data segment through a receiving amplifier, a multiplexer, and an output buffer. The receiving amplifier is activated by a corresponding start signal, and amplifies a tiny signal generated on the global input-output line. The multiplexer is a parallel-serial conversion circuit that transmits a plurality of stored information simultaneously read from the memory array to the output buffer in time series, and the output order is controlled by a corresponding data output enable signal group.

Correspondingly, in a write operation, a data signal to be stored is inputted from a data terminal, and is transmitted to an input buffer together with a data input enable signal; and the data in the input buffer is transmitted into a word line driver through a demultiplexer, a global write driver, and the global input-output line GIO. Correspondingly, the demultiplexer is a circuit that performs serial-parallel conversion on data information continuously inputted in time series. The correspondence between the inputted data signal and the global input-output line GIO is controlled by the data input enable signal so as to match the output order in the read operation.

Referring to FIG. 4, the selector 39 may include a first switch 391 and a second switch 392. One terminal of the first switch 391 and one terminal of the second switch 392 are both connected to the main amplifier 60 to receive the reamplified readout signal; the other terminal of the first switch 391 is connected to the high-order global input-output line UGIO to receive the first flag signal 61 and be turned on; and the other terminal of the second switch 392 is connected to the low-order global input-output line LGIO to receive the second flag signal 62 and be turned on.

In the embodiments of the present disclosure, three memory sub-blocks are arranged side by side, and the memory sub-block in the middle can share the same row decoder with the adjacent memory sub-blocks without introducing an additional row decoder, thereby facilitating the increase of the capacity of the memory block with a smaller circuit area without increasing the number of memory segments in the memory sub-blocks. In addition, the second memory sub-block in the middle is configured to store the high-order bytes and the low-order bytes, and the memory sub-blocks on both sides are configured to store the high-order bytes and the low-order bytes. Thus, the memory segments storing the high-order bytes and the memory segments storing the low-order bytes share the same row decoder, thereby preventing the shared row decoder from activating a wrong word line, and facilitating the improvement of read accuracy of the memory circuit.

An embodiment of the present disclosure further provides a memory, including the memory circuit. The memory including the memory circuit can have a small volume and a large capacity to ensure an effective packaging test.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the memory circuit and the memory provided by embodiments of the present disclosure, three memory sub-blocks are arranged side by side, and the memory sub-block in the middle can share the same row decoder with the adjacent memory sub-blocks without introducing an additional row decoder, thereby facilitating the increase of the capacity of the memory block with a smaller circuit area without increasing the number of memory segments in the memory sub-blocks. In addition, the second memory sub-block in the middle is configured to store the high-order bytes and the low-order bytes, and the memory sub-blocks on both sides are configured to store the high-order bytes and the low-order bytes. Thus, the memory segments storing the high-order bytes and the memory segments storing the low-order bytes share the same row decoder, thereby preventing the shared row decoder from activating a wrong word line, and facilitating the improvement of read accuracy of the memory circuit. Moreover, in the arrangement direction of the memory sub-blocks, different memory units that are arranged side by side have different block selection addresses, thereby facilitating further preventing the shared row decoder from activating a wrong word line.

The invention claimed is:

1. A memory circuit, comprising:
a plurality of memory blocks, wherein each of the memory blocks comprises a first memory sub-block, a second memory sub-block, and a third memory sub-block arranged in sequence; the second memory sub-block comprises a first memory unit and a second memory unit; the first memory sub-block and the first memory unit are configured to store high-order bytes; the second memory unit and the third memory sub-block are configured to store low-order bytes; and in an arrangement direction of memory sub-blocks, different memory units that are arranged side by side have different block selection addresses.

2. The memory circuit according to claim 1, wherein a number of memory segments in the first memory sub-block is the same as a number of memory segments in the third memory sub-block, and a number of memory segments in the first memory unit is the same as a number of memory segments in the second memory unit.

3. The memory circuit according to claim 2, wherein a sum of the number of the memory segments in the first memory unit and the number of the memory segments in the second memory unit is equal to the number of the memory segments in the first memory sub-block.

4. The memory circuit according to claim 2, wherein memory segments storing the high-order bytes and memory segments storing the low-order bytes comprise a same number of word lines.

5. The memory circuit according to claim 1, wherein the first memory sub-block comprises a third memory unit and a fourth memory unit; the third memory sub-block comprises a fifth memory unit and a sixth memory unit; the third memory unit, the first memory unit, and the fifth memory unit are arranged side by side; the fourth memory unit, the second memory unit, and the sixth memory unit are arranged side by side; the third memory unit and the first memory unit comprise a same number of word lines; and the second memory unit and the sixth memory unit comprise a same number of word lines.

6. The memory circuit according to claim 5, further comprising: a first row decoder and a second row decoder, wherein the first row decoder is located between the third memory unit and the first memory unit, the second row decoder is located between the fourth memory unit and the second memory unit, the first row decoder is configured to activate the word lines in the third memory unit, and the second row decoder is configured to activate word lines in the fourth memory unit and the word lines in the second memory unit.

7. The memory circuit according to claim 6, further comprising: a first switch circuit, a second switch circuit and a third switch circuit, wherein the first switch circuit is connected in series between the first row decoder and the third memory unit, the second switch circuit is connected in series between the second row decoder and the fourth memory unit, the third switch circuit is connected in series between the second row decoder and the second memory unit, the first switch circuit and the second switch circuit are configured to receive a first flag signal and be turned on, the third switch circuit is configured to receive a second flag signal and be turned on, the first flag signal represents reading the high-order bytes, and the second flag signal represents reading the low-order bytes.

8. The memory circuit according to claim 5, further comprising:
   a sense amplifier, configured to amplify a readout signal of a bit line, to form a first amplification signal, and comprising a first sense amplifier, a second sense amplifier, a third sense amplifier and a fourth sense amplifier, wherein the first sense amplifier is configured to amplify a readout signal of a bit line in the first memory unit, the second sense amplifier is configured to amplify a readout signal of a bit line in the second memory unit, the third sense amplifier is configured to amplify a readout signal of a bit line in the third memory unit, and the fourth sense amplifier is configured to amplify a readout signal of a bit line in the fourth memory unit; and
   a first control unit and a second control unit, wherein the first control unit is located between the first sense amplifier and the third sense amplifier, the second control unit is located between the second sense amplifier and the fourth sense amplifier, the first control unit is configured to control the third sense amplifier, and the second control unit is configured to control the fourth sense amplifier and the second sense amplifier.

9. The memory circuit according to claim 8, further comprising: a fourth switch circuit, a fifth switch circuit and a sixth switch circuit, wherein the fourth switch circuit connects the second control unit and the second sense amplifier, the fifth switch circuit connects the first control unit and the third sense amplifier, the sixth switch circuit connects the second control unit and the fourth sense amplifier, the fifth switch circuit and the sixth switch circuit are configured to receive a first flag signal and be turned on, the fourth switch circuit is configured to receive a second flag signal and be turned on, the first flag signal represents reading the high-order bytes, and the second flag signal represents reading the low-order bytes.

10. The memory circuit according to claim 8, wherein the first control unit and the second control unit are both located between the first memory sub-block and the second memory sub-block.

11. The memory circuit according to claim 5, further comprising: a third row decoder and a fourth row decoder, wherein the third row decoder is located between the first memory unit and the fifth memory unit, the fourth row decoder is located between the second memory unit and the sixth memory unit, the third row decoder is configured to activate the word lines in the first memory unit and word lines in the fifth memory unit, and the fourth row decoder is configured to activate the word lines in the sixth memory unit.

12. The memory circuit according to claim 1, further comprising: a local input-output line, a main amplifier and a global input-output line, wherein the local input-output line is configured to transmit a readout signal amplified by a sense amplifier, the readout signal amplified by the sense amplifier is marked as a first amplification signal, the main amplifier is configured to receive and amplify the first amplification signal to obtain a second amplification signal and further configured to transmit the second amplification signal to the global input-output line.

13. The memory circuit according to claim 12, wherein the local input-output line comprises a first local input-output line and a third local input-output line, the first local input-output line is connected to the first memory sub-block, and the third local input-output line is connected to the third memory sub-block; the global input-output line comprises a high-order global input-output line and a low-order global input-output line; and the memory circuit further comprises:
   a seventh switch circuit, configured to connect the first local input-output line and the high-order global input-output line, and further configured to receive a first flag signal and be turned on, wherein the first flag signal represents reading the high-order bytes; and
   an eighth switch circuit, configured to connect the third local input-output line and the low-order global input-output line, and further configured to receive a second flag signal and be turned on, wherein the second flag signal represents reading the low-order bytes.

14. The memory circuit according to claim 13, wherein the local input-output line further comprises a second local input-output line connected to the second memory sub-block; and the memory circuit further comprises:
   a selector, provided with one terminal connected to the second local input-output line to receive the first flag signal or the second flag signal, wherein when the first flag signal is received, the second local input-output line and the high-order global input-output line are connected; and when the second flag signal is received, the second local input-output line and the low-order global input-output line are connected.

15. A memory, comprising the memory circuit according to claim 1.

* * * * *